United States Patent [19]

Nebenzahl et al.

[11] Patent Number: 4,880,496
[45] Date of Patent: Nov. 14, 1989

[54] METHOD AND DEVICE FOR SUBMICRON PRECISION PATTERN GENERATION

[76] Inventors: Isaiah Nebenzahl, 14 Beruria Street; Aaron Lewis, 18 Neve Shaanan Street, both of Jerusalem, Israel

[21] Appl. No.: 212,532

[22] Filed: Jun. 28, 1988

[30] Foreign Application Priority Data

Jun. 30, 1987 [IL] Israel ............................................ 83038

[51] Int. Cl.$^4$ .................... B44C 1/22; C03C 15/00; C03C 25/06
[52] U.S. Cl. ................................. 156/643; 156/644; 156/654; 156/655; 156/345; 219/121.69; 219/121.85; 219/121.68; 427/53.1
[58] Field of Search ............... 156/640, 643, 644, 654, 156/655, 658, 345; 427/14.1, 53.1, 54.1, 55, 256; 118/50.1, 620, 623; 219/121.68, 121.69, 121.85

[56] References Cited

U.S. PATENT DOCUMENTS

| | | | |
|---|---|---|---|
| 3,039,515 | 6/1962 | Figlio et al. | 156/640 X |
| 3,188,284 | 6/1965 | Flinn et al. | 156/640 X |
| 3,447,985 | 6/1969 | Seitz | 156/640 |
| 3,597,289 | 8/1971 | Kohl et al. | 156/640 |
| 4,359,360 | 11/1982 | Harris et al. | 156/640 X |

Primary Examiner—William A. Powell
Attorney, Agent, or Firm—Browdy and Neimark

[57] ABSTRACT

A method and device for creating patterns on a wide variety of substrates. The dimensions are variable in a wide range, from sub-microscopic and upwards. The device can also be used for microsurgery type manipulations in genetic engineering: a variety of substances can be introduced into biological cells. The production of patterns is based on the guidance of the radiation, electron beam etc. via a tube having a small-diameter tapered end which is metal-coated, and which can be brought to very close proximity of the substrate.

15 Claims, 1 Drawing Sheet

METHOD AND DEVICE FOR SUBMICRON PRECISION PATTERN GENERATION

THE INVENTION

The invention relates to a device and to a method for creating predetermined patterns of great precision and small dimensions on a desired substrate. The pattern is generated by the application of controlled electromagnetic radiation, electrons, particle beams, chemicals and the like. Application is via a tip of a finely tapered tube, such as a small size capillary tube, which has an internal diameter of very small size, and which can be manipulated so as to approach the substrate to a very small distance. Patterns of high accuracy can be obtained. The device can be used for very delicate manipulations, as for example, in genetic engineering. Other aspects will become apparent hereinafter.

BACKGROUND OF THE INVENTION

Modern industry has much use for methods and devices that are capable of very high precision. There are many examples of this such as the production of masks with high precision and density, the high density placement of electronic circuitry on a semiconducting crystal, the creation of precisely positioned apertures, the creation of small nondestructive openings that permit the insertion of various components into cells, and the development of precisely positioned patterns of molecules of various substrates. Currently, the highest precision obtainable is using electron beam lithographic techniques. In the present invention use is made of light, chemicals or electrons guided or contained in finely drawn pipettes that can be used to produce microchemical alterations with a precision that has generally been reserved for extremely expensive electron beam based techniques that only work in vacuum.

STATE OF PRIOR ART

Light induced chemical alterations with a resolution of several tenths of microns have been achieved by illuminating a mask with deep uv. light (J.C. White et.al., Appl.Phys.Lett. 44, 22 (1984). Alternately, a mask can be brought within the near-field of a substrate and exposed with any wavelength of light (A. Lewis and M. I. Isaacson, U.S. Pat. No. 4,659,429). Within the near-field the resolution is that of the mask and not of diffraction. Therefore, a finely produced mask can overcome the diffraction limit. To produce such high resolution masks an electron beam lithography device is needed. The current price of such devices is in the region of one million dollars or more and these devices only work in vacuum. Therefore, there is a need for alternative methodologies and devices. Because of this a pattern generator was reported based on the use of uv laser light /U. Boettiger, and B. Hafner, Lambda Highlights #4, April (1987)/. This method however uses imaging of the desired pattern on the surface of the material to be processed. Therefore, it is naturally limited by the diffraction of light with further deterioration in the resolution caused by the limited quality of the optics and the multimode nature of the lasers used in this regime.

In the present invention light is guided to the immediate proximity of the surface to be processed by the use of a pipette. The processed surface is within the near-field of the opening of the pipette. Therefore, the illumination is limited to the order of the diameter of the pipette that can be much smaller than a wavelength. In this way the diffraction limit is circumvented. This is a use in materials processing of a similar idea that was previously suggested for subwavelength microscope (A. Lewis, M.I. Isaacson, E. Betzig and A. Harootunian, U.S. Patent Pending). The use of precisely positioned chemicals has not been reported.

SUMMARY OF THE INVENTION

The present invention relates to a device for generating precision micropatterns, or for effecting manipulations with a high degree of accuracy, in various fields of industry and applied science. The invention further relates to method for effecting such creation of patterns, and for carrying out such micromanipulations. According to the invention it is possible to create patterns of predetermined shape and size on a wide variety of substrates, with a very high degree of accuracy and resolution. The device is capable of making patterns of very small dimensions by means of electromagnetic radiation, electron beams, chemicals, sound waves, etc., based on the application of the desired energy or chemical via a tapered tube having an outlet of extremely small dimensions, and which can be brought to a very small distance from the substrate by the device. The outlet of the tube will generally be in such proximity of the substrate as to avoid diffraction. Pipettes or capillary tubes used according to the invention have an internal diameter at the outlet as small as about 20 nm, which capillary tubes can be produced by a suitable heating of glass. Such pipettes are mechanically strong and flexible. They can be used as such, or they can be coated on the inside and/or the outside by any desired coating. Metals or carbon are suitable coatings for a variety of applications. When a widediameter radiation is introduced at one end of a capillay tube which has an outlet of this order of diameter, such beam is transformed into one having the dimensions of the outlet. This applies to a wide variety of radiations, from X-rays to light in the visible range. It applies also to sound waves, particle waves, etc.

DESCRIPTION OF THE INVENTION

Figure 1:
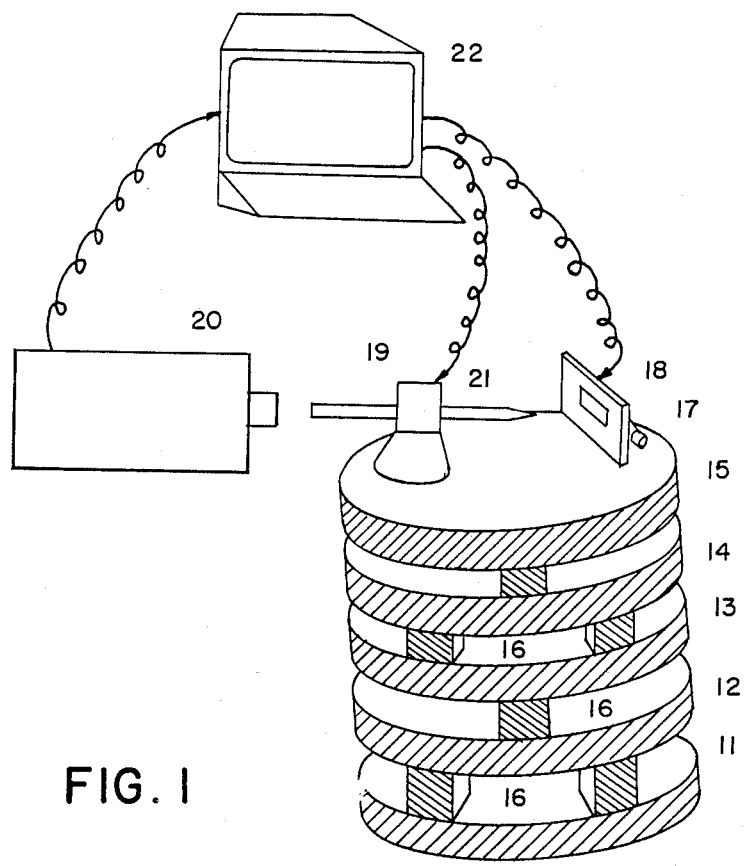
FIG. 1 is a schematic perspective view, not according to scale, of a system according to the invention.

Tapered Tubes The best example of these tapered tubes are glass pipettes. These glass pipettes of initial inner diameter of about 0,5 mm can be pulled to diameters of characteristically <20 nm by appropriately heating the glass. These pipettes are strong and flexible and can be coated on the inside and outside with a variety of materials such as metals or carbon or left uncoated. It has been shown that such devices have the property of transforming a wide diameter radiation beam into a beam of diameter similar to that of the pipette. This has been shown for radiation from the visible to the x-ray regime. The same is true for any kind of waves including sound waves and particles. Characteristically, a pipette is an alumina glass tube of outer diameter of 1 mm and length of 70 mm, of which the last 20 mm are gradually tapered down to an inner diameter of 100 nm and an outer diameter of 0.1 mm, coated with gold.

Parts of the Device

A device according to the present invention is shown in FIG. 1. It consists of the following parts:

1. A platform of up to five plates (part numbers 11 to 15) of typical dimensions of 10 mm × 200 mm diameter made of stainless steel or aluminum mechanically isolated one from another by an elastic material 16 such as Viton® thickness 10 mm, to avoid transmission of vibrations from the environment or from induced vibrations due to the operation of the instrument.

2. A gross positioning xyz stage 17 on which the substrate holder 18 sits in order to move the substrate closer to the pipette and to move the substrate with gross steps in the xy directions. Typical precision of this stage is 1 micrometer in each of the 3 dimensions.

3. A fine positioning xyz stage composed of e.g. a cylindrical piezoelectric device 19 which is sitting on plate 15. Typical precision of this stage is 0.1 micrometer in each dimension, and maximum path of 10 micrometers in each dimensions.

4. A delivery system 20 for electromagnetic radiation, chemicals, sound or electrons to be guided by the pipette. A typical delivery system is a uv laser, such as an excimer laser.

5. A pipette 21 to guide the radiation, chemicals, sound or electrons to the substrate.

6. A computer 22 to control all operations: motion of the two stages according to a predetermined pattern, in coordination with part number 20, e.g. the pulses of the laser.

Operation of the Device

A substrate is placed on part 18 and is moved visually under a microscope to a position within a few microns of the pipette. The pipette which is covered by metal at least at its tip is then brought in a series of steps by the piezoelectric device to the desired offset of the substrate surface. A quantity is measured that depends strongly on the distance of the pipette tip from the surface. An example of such a measurable quantity is the tunneling of electrons from the surface to the pipette. Such a measurement can be used to bring the pipette to within 2 nm of the surface without actually touching the surface. This tunneling current is also used to continually control the pipette/substrate or z distance which is critical to the resolution of the pattern being created. As an example of the use of electromagnetic radiation a uv laser (e.g. an excimer laser or a frequency doubled mode-locked laser) is aligned relative to the pipette with the help of the delivery system. A computer controls the electrical signal of the piezoelectric crystal in order to bring the pipette to the desired xy direction while keeping z distance constant. When this is completed a laser pulse is produced and the hole is ablated in the material. In the same way a whole sequence of holes is made so that a pattern is generated. The computer contains in its memory the whole pattern to be produced which is fed to it by its hardware and software. After the pattern is produced in the area covered by the fine stage (part number 3) the substrate is moved by 17 to a new position where a further section of the pattern is then generated. This procedure is necessary because the fine positioning stage 19 can only move the pipette by about 10 micrometers. The aligning of each section in the mosaic with respect to the previous section can be achieved by using tunneling to detect the relative position of the section just completed with respect to the section to be started. Tunneling can also be used to drive the pipette into the hole in order to create patterns with greater depth than the near-field collimation of the radiation. Another example of a measurable quantity for detecting the substrate/pipette separation is the capacitance between the two. A third example of a measurable quantity is the force between the pipette and the surface. In addition to tunneling, capacitance and force another automatic sensor of the creation of the hole by the laser pulse in opaque substrates can be incorporated into the instrument by including a helium neon or other cheap laser to illuminate the region of the substrate being patterned. This characterization laser will be placed on the side of the substrate that is opposite to the pipette. In this arrangement the pipette is used to collect the first few photons of light and a sensitive photomultiplier detects these photons. The photomultiplier is electrically connected with the uv laser and the stages in order to control the delivery of the uv laser light to the substrate. Alternately the characterization laser can be transmitted through the pipette colinearly with the excimer laser and the photomultiplier can be placed on the side of the substrate which is opposite to the pipette.

Further Applications of the Device

The precise positioning of a metal tipped pipette over a substrate can have a great deal of application besides the creation of patterns for masks for microelectronics, the direct writing in microelectronic materials or the correction of microelectronic circuits. For example, tunneling can be used to also create patterns. Thus, specialized even smaller features on top of the large pattern exposed by the delivery of uv light to the substrate by the pipette is possible by the use of tunneling to create these features. In addition to this the pipette can also be used to contain catalytic or other molecules that can be brought close to a surface that can be affected with these molecules. For example, with certain enzymes it will be possible to cut a specified point relative to a specific end of a DNA molecule. Alternately, sound traversed through the pipette or similar pointed device could be used to produce the surgical removal of a specified part of a molecule such as DNA or the precisely positioned sound spot could be used for other materials processing or other applications. One such application could be the creation of small openings in cell membranes to aid the insertion of genetic materials into cells. Alternately, the uv laser through the pipette can be used for this application. Finally, the creation of a set of such precise, small holes in a material can be very successfully used to create a high density optical information storage disk with the reading beam being the characterization laser described above. Depending o the material being employed and the wavelength of light through the pipette the optical disk could be a write once, read only disk or a read/write erasable disk.

ADVANTAGES

There is no instrument capable of the versatility of our pattern generator. The closest device that can be considered as a comparison is the electron beam lithography systems which are considerably more complicated, rather expensive and much less versatile.

DETAILED DESCRIPTION

A device has been constructed as shown in FIG. 1. Five alumina plates have been stacked with Viton® insulation of 10 mm width between them. The dimensions of the aluminum plates were 10 mm thickness by 100 mm diameter. This arrangement gave excellent isolation against high frequency vibrations. To protect against low frequencies, the whole stack was mounted on an inflated rubber toroidal tube of a tire. The substrate consisted in this experiment of a photoresist of type Selectilux N6O of Merck Company. The pattern that was ablated into this material consisted of a linear series of holes of 3 micrometers in diameter. Each hole was drilled by 15 firings of an excimer laser of wavelength 193 nm. The energy per pulse was 200 mJ. Because the pipette acted as an aperture, only a small fraction of this energy reached the substrate. The energy density at the substrate was approximately 1.58 $J/cm^2$ per pulse. The holes thus produced were of more than 3 micrometers in depth and had sharp ( <0.3 micrometer) and steep walls. The pipette had a 3 um inner diameter and was coated with aluminum.

We claim:

1. A device for creating a predetermined pattern on a substrate of a dimension from atomic dimension and up to small sizes, which comprises means for holding such substrate in a manner isolated from vibrations, means comprising a holder of a tube which is movable in all three dimensions respective said substrate and substrate holder, said tube having an end tapered to a very thin outlet, said end of the tube being coated with a metal coating, said outlet corresponding to the dimension of the desired pattern means for guiding and applying via such tube a predetermined radiation, electron beam, chemical or sound wave adapted to create on said substrate the desired pattern, the distance of the tapered end of the tube from the substrate being such that diffraction is avoided and thus the precision of the pattern is governed by the inner diameter of the tube and by the accuracy of the mechanical positioning device.

2. A device according to claim 1, providing means for holding a biological cell, said tube serving for the introduction of genetic material into said cell.

3. A device according to claim 1, where the substance is a semiconductor and the product is a mask for microelectronics.

4. A device according to claim 1, comprising means for applying a chemical or thermal energy, resulting in a pattern or in a predetermined ablation.

5. A device according to claim 1, comprising means for applying via said tube a catalyst to any predetermined location.

6. A device according to claim 1, for the direct production of microelectronic components in microelectronic circuits.

7. A device according to claim 1 comprising means for making holes at predetermined locations of a substrate.

8. A device according to claim 1, for creating an engraved pattern which comprises means for applying a tunneling current flowing between the tapered tube and the substrate.

9. A device according to claim 1 where the energy is that of a laser beam.

10. A method for creating a predetermined pattern on a given substrate, comprising holding the substrate in a manner shielded from vibrations, applying the required energy or chemical material via a tube having a tip of very small predetermined internal dimension, which is metal-coated, moving such tube in a manner as to approach the substrate in a predetermined manner to a desired distance, applying said energy or chemical material via said tip of the tube, thus creating by suitable movement the desired pattern.

11. A method according to claim 10 where the energy is applied in the form of an electron beam, radiation, or sound wave.

12. A method according to claim 10, where a tunneling current is applied between the tip of the tube and the substrate, and where the movement of the substrate is controlled in such a manner that a desired pattern is created.

13. A method according to claim 10, wherein a laser beam is applied to the substrate via the tube.

14. A method for introducing genetic material into a cell, comprising holding the cell in a manner shielded from vibrations, applying the required genetic material via a tube having a tip of very small predetermined internal dimension, which is metal-coated, moving such tube in a manner as to approach the cell in a predetermined manner to a desired distance, applying said genetic material via said tip of the tube, resulting in the introduction of genetic material into a cell.

15. A method according to claim 14, wherein the cell is manipulated so as to introduce genetic material at a predetermined location of the cell.

* * * * *